(12) United States Patent
Endo

(10) Patent No.: US 6,937,529 B2
(45) Date of Patent: Aug. 30, 2005

(54) SEMICONDUCTOR MEMORY DEVICE PERFORMING RELIABLE DATA SENSING

(75) Inventor: Toru Endo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/829,960

(22) Filed: Apr. 23, 2004

(65) Prior Publication Data

US 2005/0162942 A1    Jul. 28, 2005

(30) Foreign Application Priority Data

Jan. 26, 2004  (JP) .............................. 2004-016426

(51) Int. Cl.$^7$ ................................................ G11C 7/00
(52) U.S. Cl. .................. 365/189.09; 365/205; 365/145
(58) Field of Search .................. 365/189.09, 205, 365/145

(56) References Cited

U.S. PATENT DOCUMENTS 6,049,481 A * 4/2000 Yamasaki .............. 365/189.09
6,442,080 B2 * 8/2002 Tanzawa et al. ....... 365/189.09

FOREIGN PATENT DOCUMENTS

| JP | 2002-133857 | 5/2002 |
| JP | 2002-157876 | 5/2002 |

* cited by examiner

Primary Examiner—Huan Hoang
(74) Attorney, Agent, or Firm—Arent Fox, PLLC.

(57) ABSTRACT

A semiconductor memory device includes a first reference circuit which generates a first reference potential, a second reference circuit which generates a second reference potential, a memory cell, a first sense amplifier which senses a data potential read from the memory cell through comparison with the first reference potential, and a second sense amplifier which senses the data potential read from the memory cell through comparison with the second reference potential, wherein the first sense amplifier and the second sense amplifier cooperate to determine whether the data potential is "0" or "1", the first reference potential being positioned on a highest potential side of a data potential distribution of a "0" data potential read from the memory cell, and the second reference potential being positioned on a lowest potential side of a data potential distribution of a "1" data potential read from the memory cell.

10 Claims, 14 Drawing Sheets

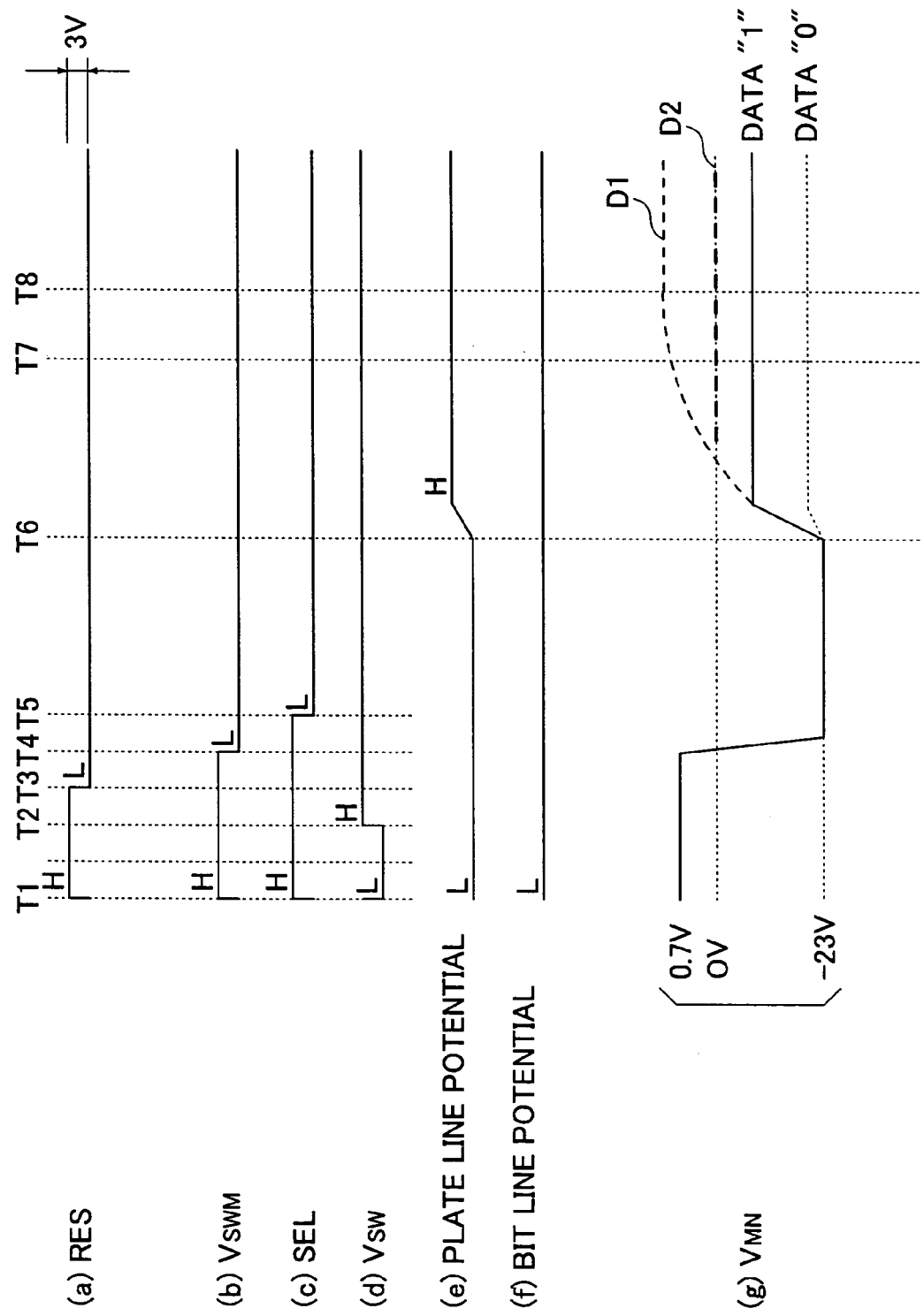

SEMICONDUCTOR MEMORY DEVICE PERFORMING RELIABLE DATA SENSING

CROSS-REFERENCE TO RELATED APPLICATIONS

The present application is based upon and claims the benefit of priority from the prior Japanese Patent Application No. 2004-016426 filed on Jan. 26, 2004, with the Japanese Patent Office, the entire contents of which are incorporated herein by reference.

BACKGROUND OF THE INVENTION

1. Field of the Invention

The present invention generally relates to semiconductor memory devices, and particularly relates to a semiconductor memory device which senses data by comparing a data potential with reference potentials.

2. Description of the Related Art

In semiconductor memory devices such as a DRAM (dynamic random access memory), a flash memory, and a ferroelectric memory, generally, a potential of read data is compared with a predetermined reference potential to perform the sensing of data. The sense amplifier that performs the sensing of data needs to accurately detect HIGH data and LOW data that are read from a memory core. There is thus a need for the provision of a proper reference potential.

FIG. 1 is a drawing showing an example of the construction of a related-art semiconductor memory device. The semiconductor memory device of FIG. 1 is illustrated by taking a ferroelectric memory as an example, and is provided with two sense amplifiers for the purpose of sensing data from 1T1C-type memory cells. One sense amplifier compares a data potential with a HIGH reference potential, and the other sense amplifier compares the data potential with a LOW reference potential.

The semiconductor memory device of FIG. 1 includes an address buffer 10, pre-sense amplifiers 11-0 and 11-1 for reference cells, pre-sense amplifiers 12-0 through 12-n for memory cells, a sense amplifier 13 for reference cells, sense amplifiers 14-0 through 14-n and 15-0 through 15-n for memory cells, an output buffer 16, reference cells R00 through R11, and memory cells C00 through Cn1.

Each of the memory cells and the reference cells is comprised of a ferroelectric capacitor and an access transistor. Word lines WL0 and WL1 are connected to the gate of the access transistors. For the sake of simplicity, only two word lines are illustrated with respect to two rows of memory cells. In actuality, however, a number of word lines may be arranged with respect to a number of memory cell rows. The address buffer 10 selectively activates a word line corresponding to an input address, thereby making access transistors conductive, resulting in one end of ferroelectric capacitors being coupled to bit lines/BLR and BLR and BL0 through BLn. The other end of the ferroelectric capacitors is connected to either a plate line CP0 or a plate line CP1.

A positive or negative voltage is applied to a ferroelectric capacitor to cause polarization, thereby performing data writing. The presence/absence of a polarization reversal current in responses to a positive potential applied to the ferroelectric capacitor is detected, thereby performing data reading. In data writing, the word line WL is selected (HIGH) to make corresponding access transistors conductive. When a positive or negative voltage is applied between a bit line and a plate line, this voltage is applied to a ferroelectric capacitor, resulting in specified data being written. In data reading, a word line is selected to make corresponding access transistors conductive, and a plate line is set to a power supply potential. As a result of this operation, electric charge in amounts corresponding to the data stored in a ferroelectric capacitor moves to a bit line. The current caused by the movement of electric charge is sensed and converted into a voltage signal by the pre-sense amplifiers 11-0 and 11-1 and 12-0 through 12-n.

The sense amplifier 13 for reference cells compares a LOW potential read from a reference cell with a HIGH potential read from another reference cell for amplification of a potential difference. With this, a LOW reference potential Lref and a HIGH reference potential Href are generated.

FIGS. 2A and 2B are drawings showing signal waveforms indicative of the operation of sense amplifiers for memory cells. The HIGH reference potential Href illustrated by solid lines and a data potential illustrated by dotted lines are compared with each other by a latch-type sense amplifier (one of 14-0 through 14-n) as indicated as "SENSING BY LSA". Further, the LOW reference potential Lref illustrated by solid lines and the data potential illustrated by dotted lines are compared with each other by a latch-type sense amplifier (one of 15-0 through 15-n) as indicated as "SENSING BY RSA".

FIG. 2A shows signal waveforms indicative of a sense amplifier operation when a data potential read from a memory cell is HIGH. In this case, sensing by LSA has difficulty amplifying a difference of input potentials because the two input potentials for comparison are substantially equal or have little difference. Sensing by RSA, on the other hand, properly amplifies a difference of input potentials because the two input potentials for comparison have a sufficient difference that is required for latching operation. As a result, the data potential shown by dotted lines becomes HIGH while the LOW reference potential Lref shown by solid lines becomes LOW. Since the data potential is pulled toward HIGH, the potential Href becomes LOW in the sensing operation by LSA.

FIG. 2B shows signal waveforms indicative of a sense amplifier operation when a data potential read from a memory cell is LOW. In this case, sensing by RSA has difficulty amplifying a difference of input potentials because the two input potentials for comparison are substantially equal or have little difference. Sensing by LSA, on the other hand, properly amplifies a difference of input potentials because the two input potentials for comparison have a sufficient difference that is required for latching operation. As a result, the data potential shown by dotted lines becomes LOW while the HIGH reference potential Href shown by solid lines becomes HIGH. Since the data potential is pulled toward LOW, the potential Lref becomes HIGH in the sensing operation by RSA.

In this manner, one of the two sense amplifiers that is given a greater difference of input potentials completes a sensing operation faster and stronger than the other during sense-amplifier amplification. The sense amplifier provided with a smaller difference of input potentials completes its sensing operation by following the operation of the other. Read data sensed by the sensing operation as described above is output to an exterior of the semiconductor memory device through the output buffer 16.

[Patent Document 1] Patent Application Publication No. 2002-157876.

[Patent Document 2] Patent Application Publication No. 2002-133857.

A data potential read from an actual memory cell (or reference cell) conforms to a certain distribution due to process manufacturing variation. FIG. 3 is a diagram showing an example of a data potential distribution. A horizontal axis represents a data potential read from a memory cell, and a vertical axis represents the number of cells that exhibit respective data potentials. Memory cells having data "0" written therein conform to a data potential distribution 20, and memory cells having data "1" written therein conform to a data potential distribution 21. Such data-potential distribution map is obtained by plotting the number of bits of failed cells while changing a reference potential gradually on the horizontal axis.

FIG. 3 illustrates a data potential distribution that provides correct data reading. All the data potentials of memory cells having "0" data that conform to the data potential distribution 20 are distanced farther away from the HIGH reference potential Href than from the LOW reference potential Lref. It follows that sensing operation driven by the reference potential Href becomes predominant, resulting in all the data of memory cells having "0" data being sensed as LOW. Also, all the data potentials of memory cells having "1" data that conform to the data potential distribution 21 are distanced farther away from the LOW reference potential Lref than from the HIGH reference potential Href. It follows that sensing operation driven by the reference potential Lref becomes predominant, resulting in all the data of memory cells having "1" data being sensed as HIGH.

FIG. 4 is a diagram showing a data potential distribution in the case where data reading produces an incorrect result. In FIG. 4, a data potential 22 that belongs to a data potential distribution 20A of memory cells with "0"1 data is positioned at a distance A from the LOW reference potential Lref, which is greater than a distance B from the HIGH reference potential Href. As a result, sensing operation driven by the reference potential Lref becomes predominant, resulting in the "0"1 data of memory cells having the data potential 22 being sensed as HIGH. As for the memory cells having "1"data that conform to a data potential distribution 21A, all the data potentials are distanced farther away from the LOW reference potential Lref than from the HIGH reference potential Href. It follows that sensing operation driven by the reference potential Lref becomes predominant, resulting in the "1" data of these memory cells being sensed as HIGH.

Accordingly, there is a need for a semiconductor memory device in which data reading is correct regardless of data potential distributions when data sensing is performed by comparing a data potential with a plurality of reference potentials.

SUMMARY OF THE INVENTION

It is a general object of the present invention to provide a semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages in accordance with the purpose of the invention, the invention provides a semiconductor memory device, including a first reference circuit which generates a first reference potential, a second reference circuit which generates a second reference potential, a memory cell, a first sense amplifier which senses a data potential read from the memory cell through comparison with the first reference potential, and a second sense amplifier which senses the data potential read from the memory cell through comparison with the second reference potential, wherein the first sense amplifier and the second sense amplifier cooperate to determine whether the data potential is "0" or "1", the first reference potential being positioned on a highest potential side of a data potential distribution of a "0" data potential read from the memory cell, and the second reference potential being positioned on a lowest potential side of a data potential distribution of a "1" data potential read from the memory cell.

In the semiconductor memory device described above, the first reference potential is offset so as to be always positioned on the highest potential side of the data potential distribution corresponding to "0" memory cells, and the second reference potential is offset so as to be always positioned on the lowest potential side of the data potential distribution corresponding to "1" memory cells. This prevents data reading from producing incorrect results.

Further, the first reference potential may be set equal to or higher than the highest data potential of the data potential distribution corresponding to "0" memory cells, and the second reference potential may be set equal to or lower than the lowest data potential of the data potential distribution corresponding "1" memory cells (while maintaining the first reference potential< the second reference potential). This also guarantees correct data sensing.

BRIEF DESCRIPTION OF THE DRAWINGS

Other objects and further features of the present invention will be apparent from the following detailed description when read in conjunction with the accompanying drawings, in which:

FIG. 15 is a timing chart showing the operation of a circuit shown in FIG. 14.

DESCRIPTION OF THE PREFERRED EMBODIMENTS

Figure 5:
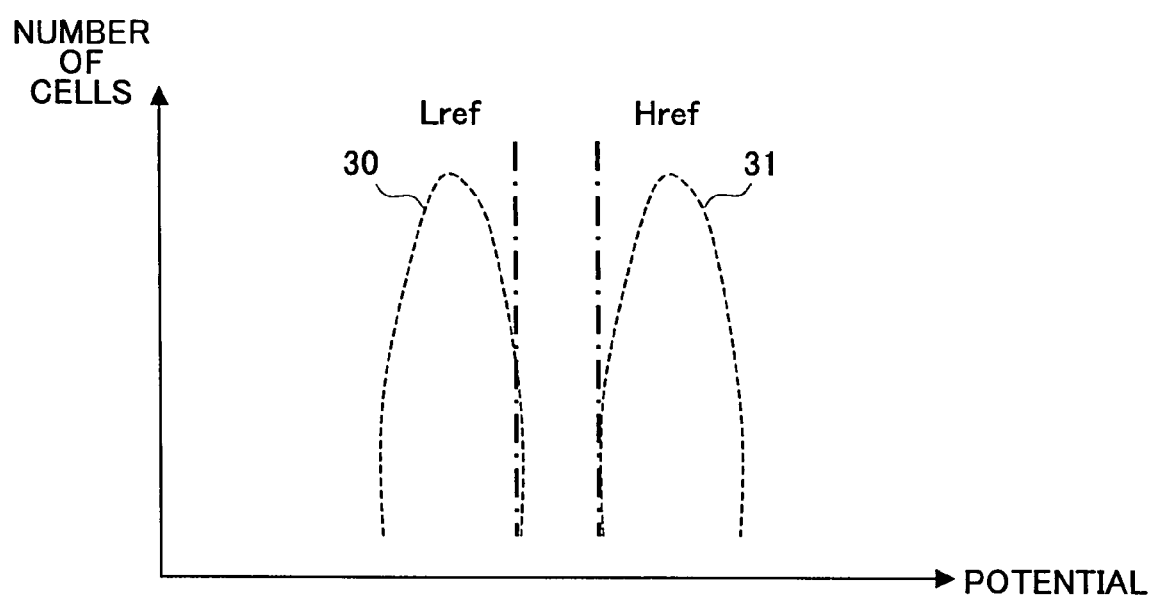
FIG. 5 is a diagram showing the positioning of reference potentials according to the invention.

FIG. 5 is a diagram showing the positioning of reference potentials according to the invention.

In FIG. 5, memory cells having "0" data stored therein conform to a data potential distribution 30, and memory cells having "1" data stored therein conform to a data potential distribution 31. In the invention, the LOW reference potential Lref is set at the position of the highest data potential in the data potential distributions 30 of memory cells having "0" stored therein, and the HIGH reference potential Href is set at the position of the lowest data potential in the data potential distribution 31 of memory cells having "1" stored therein.

With such setting of reference potentials, it is guaranteed that all the data potentials of memory cells having "0" stored therein that conform to the data potential distribution 30 are distanced farther away from the HIGH reference potential Href than from the LOW reference potential Lref. It naturally follows that sensing operation driven by the reference potential Href becomes predominant, resulting in all the "0" data of the memory cells being sensed as LOW. Further, it is guaranteed that all the data potentials of memory cells having "1" stored therein that conform to the data potential distribution 31 are distanced farther away from the LOW reference potential Lref than from the HIGH reference potential Href. It naturally follows that sensing operation driven by the reference potential Lref becomes predominant, resulting in all the "1" data of the memory cells being sensed as HIGH.

Accordingly, sense amplifiers correctly sense the data of memory cells without failure. Ideally, the LOW reference potential Lref is set to the highest data potential of the data potential distribution 30, and the HIGH reference potential Href is set to the lowest data potential of the data potential distribution 31. In practice, however, the LOW reference potential Lref may be set higher than the highest data potential of the data potential distribution 30, and the HIGH reference potential Href may be set lower than the lowest data potential of the data potential distribution 31 (while maintaining Lref< Href). This also guarantees correct data sensing.

In practice, the reference potential Lref may be set with an offset so as to be positioned on the side of the highest data potential relative to the data potential distribution 30, and the reference potential Href may be set with an offset so as to be positioned on the side of the lowest data potential relative to the data potential distribution 31. Such settings produce an effect that incorrect reading is sufficiently prevented even if the reference potential Lref is lower than the highest data potential of the data potential distribution 30 and the reference potential Href is higher than the lowest data potential of the data potential distribution 31.

In the following, embodiments of the present invention will be described with reference to the accompanying drawings.

Figure 6:
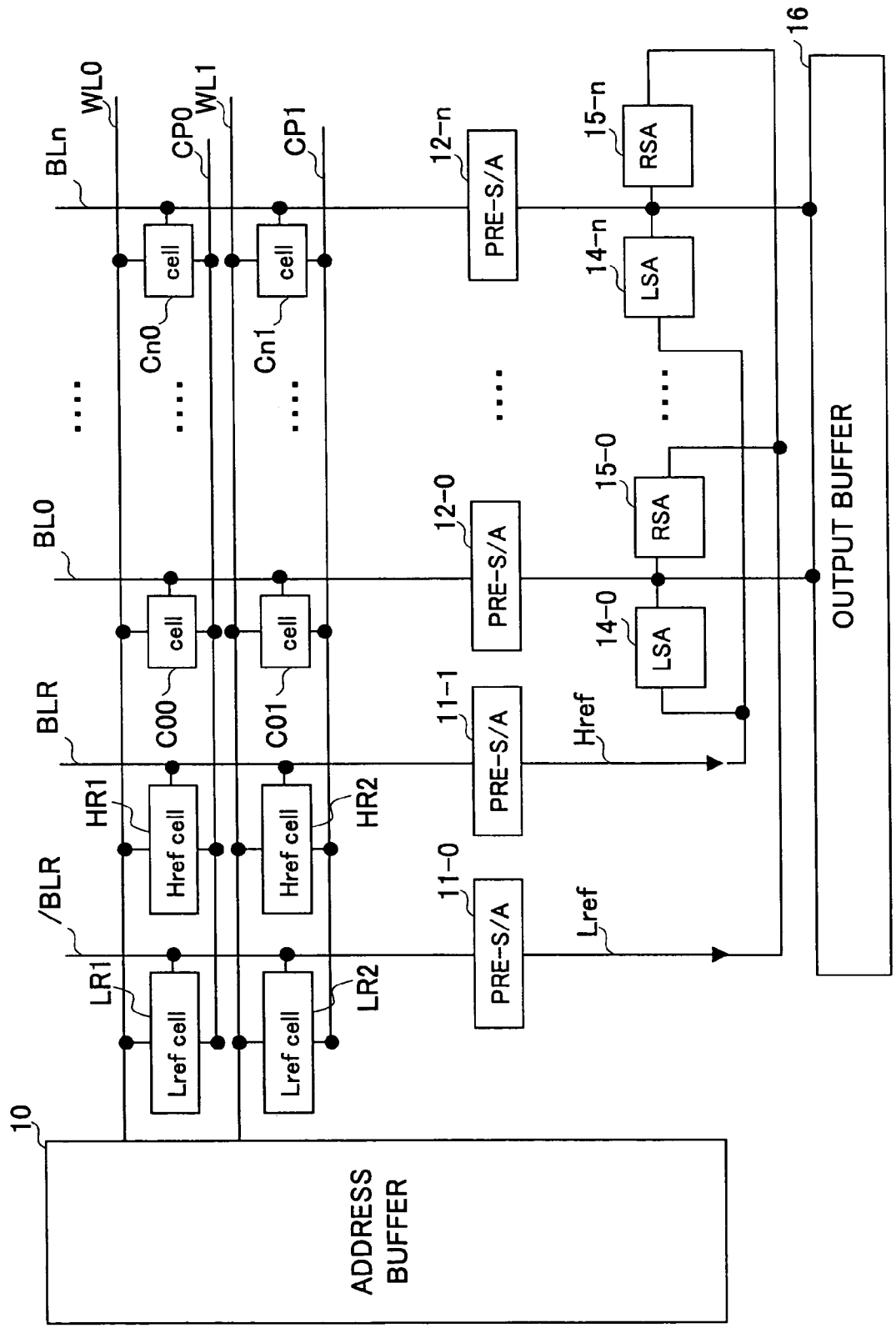
FIG. 6 is a block diagram showing the construction of a first embodiment of a semiconductor memory device according to the invention.

FIG. 6 is a block diagram showing the construction of a first embodiment of a semiconductor memory device according to the invention. The semiconductor memory device of FIG. 6 is illustrated by taking a ferroelectric memory as an example, and is provided with two sense amplifiers for the purpose of sensing data from a 1T1C-type memory cell. One sense amplifier compares a data potential with a HIGH reference potential, and the other sense amplifier compares the data potential with a LOW reference potential. Although the description of this embodiment is provided with reference to a ferroelectric memory, the present invention is not limited to such a memory construction. The invention is equally applicable to a DRAM, a flash memory, etc., as long as data sensing is performed by comparing a data potential with a plurality of reference potentials.

The semiconductor memory device of FIG. 6 includes an address buffer 10, pre-sense amplifiers 11-0 and 11-1 for reference cells, pre-sense amplifiers 12-0 through 12-n for memory cells, sense amplifiers 14-0 through 14-n and 15-0 through 15-n for memory cells, an output buffer 16, reference cells LR1, LR2, HR1 and HR2, and memory cells C00 through Cn1.

Each of the memory cells C00 through Cn1 and the reference cells LR1, LR2, HR1 and HR2 is comprised of a ferroelectric capacitor and an access transistor. Word lines WL0 and WL1 are connected to the gate of the access transistors. For the sake of simplicity, only two word lines are illustrated with respect to two rows of memory cells. In actuality, however, a number of word lines may be arranged with respect to a number of memory cell rows. The address buffer 10 selectively activates a word line corresponding to an input address, thereby making access transistors conductive, resulting in one end of ferroelectric capacitors being coupled to bit lines /BLR and BLR and BL0 through BLn. The other end of the ferroelectric capacitors is connected to either a plate line CP0 or a plate line CP1.

A positive or negative voltage is applied to a ferroelectric capacitor to cause polarization, thereby performing data writing. The presence/absence of a polarization reversal current in responses to a positive potential applied to the ferroelectric capacitor is detected, thereby performing data reading. In data writing, the word line WL is selected (HIGH) to make corresponding access transistors conductive. When a positive or negative voltage is applied between a bit line and a plate line, this voltage is applied to a ferroelectric capacitor, resulting in specified data being written. In data reading, a word line is selected to make corresponding access transistors conductive, and a plate line is set to a power supply potential. As a result of this operation, electric charge in amounts corresponding to the data stored in a ferroelectric capacitor moves to a bit line. The current caused by the movement of electric charge is sensed and converted into a voltage signal by the pre-sense amplifiers 11-0 and 11-1 and 12-0 through 12-n.

Figure 2A:
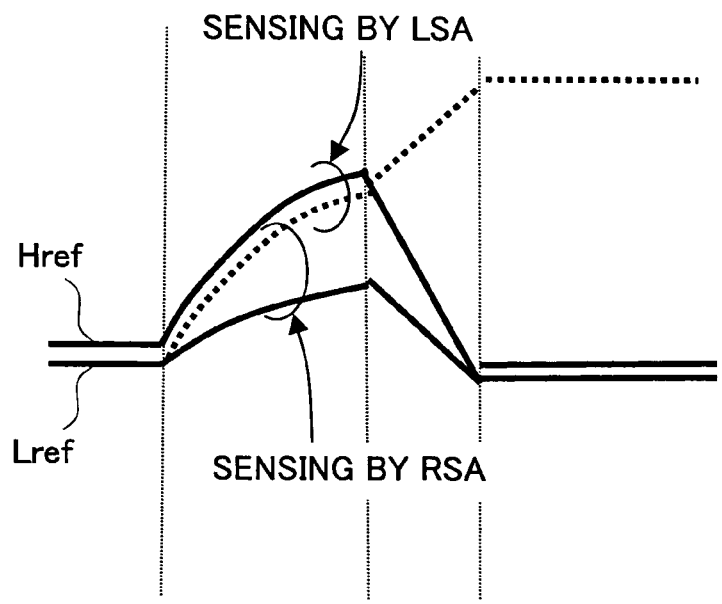
FIGS. 2A and 2B are drawings showing signal waveforms indicative of the operation of sense amplifiers for memory cells.
Figure 2B:
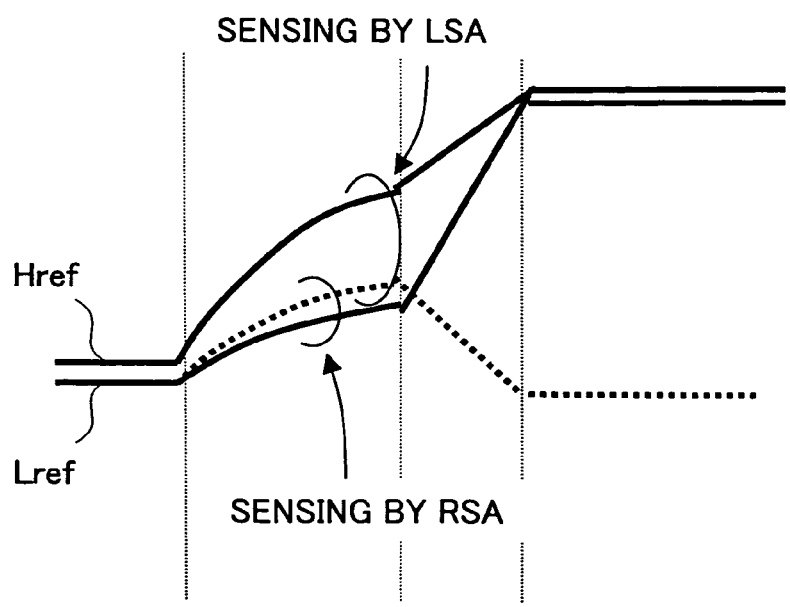
Figure 3:
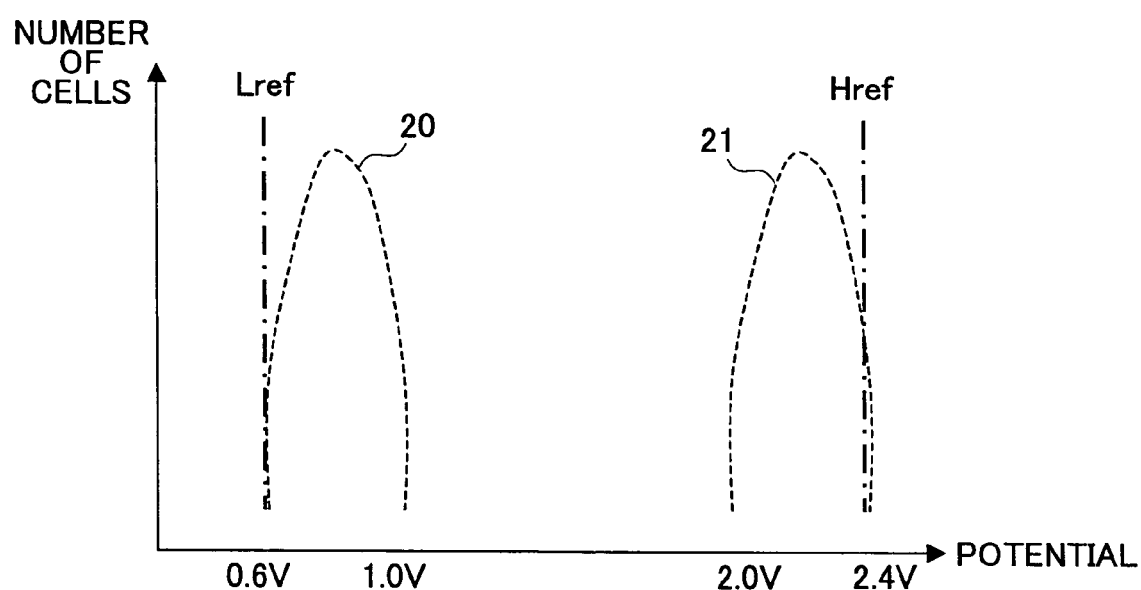
FIG. 3 is a diagram showing an example of a data potential distribution.
Figure 4:
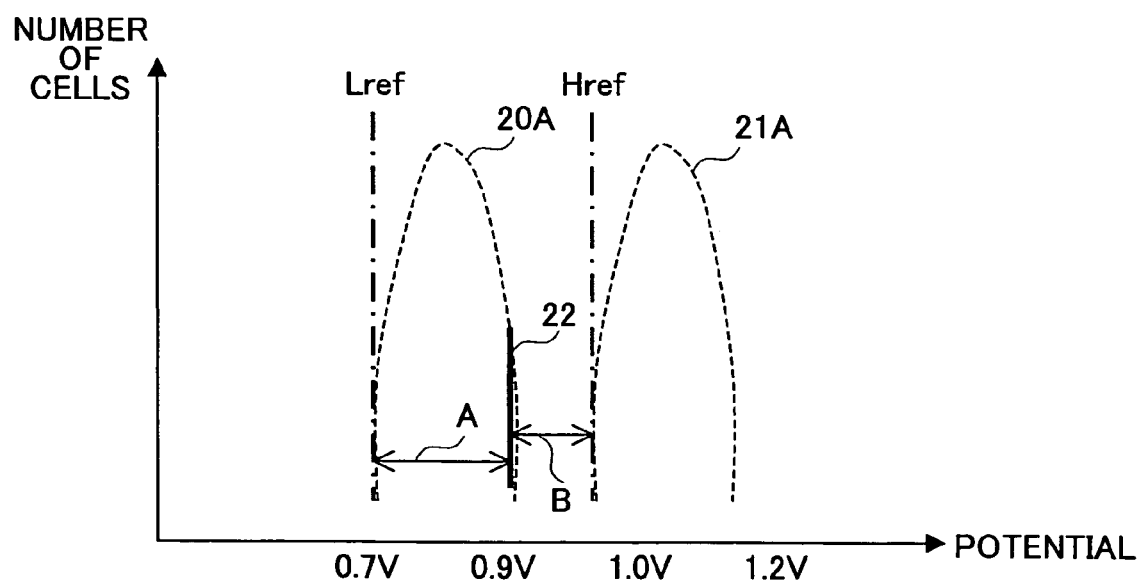
FIG. 4 is a diagram showing a data potential distribution in the case where data reading produces an incorrect result.

Operations for the sensing of data are the same as those illustrated in FIGS. 2A and 2B. The HIGH reference potential Href illustrated by solid lines and a data potential illustrated by dotted lines are compared with each other by a latch-type sense amplifier (one of 14-0 through 14-n) as indicated as "SENSING BY LSA". Further, the LOW reference potential Lref illustrated by solid lines and the data potential illustrated by dotted lines are compared with each other by a latch-type sense amplifier (one of 15-0 through 15-*n*) as indicated as "SENSING BY RSA".

At the time of amplification by sense amplifiers, one of the two sense amplifiers that is given a greater difference of input potentials completes a sensing operation faster and stronger than the other. The sense amplifier provided with a smaller difference of input potentials completes its sensing operation by following the operation of the other. Read data sensed by the sensing operation as described above is output to an exterior of the semiconductor memory device through the output buffer 16.

In this embodiment, the reference cells LR1 and LR2 for generating the LOW reference potential Lref are configured to have a larger cell area than the memory cells C00 through Cn1. Moreover, the reference cells HR1 and HR2 for generating the HIGH reference potential Href are configured to have a smaller cell area than the memory cells COO through Cn1. With this provision, the reference potential Lref is given an offset so as to be positioned on the side of the highest potential of the data potential distribution 30 of "0" memory cells, and the reference potential Href is given an offset so as to be positioned on the side of the lowest potential of the data potential distribution 31 of "1" memory cells. This provides for incorrect data reading to be prevented.

As previously described, the reference potential Lref may be set equal to or higher than the highest data potential of the data potential distribution 30, and the reference potential Href may be set equal to or lower than the lowest data potential of the data potential distribution 31 (while maintaining Lref<Href). This also guarantees correct data sensing.

Figure 1:
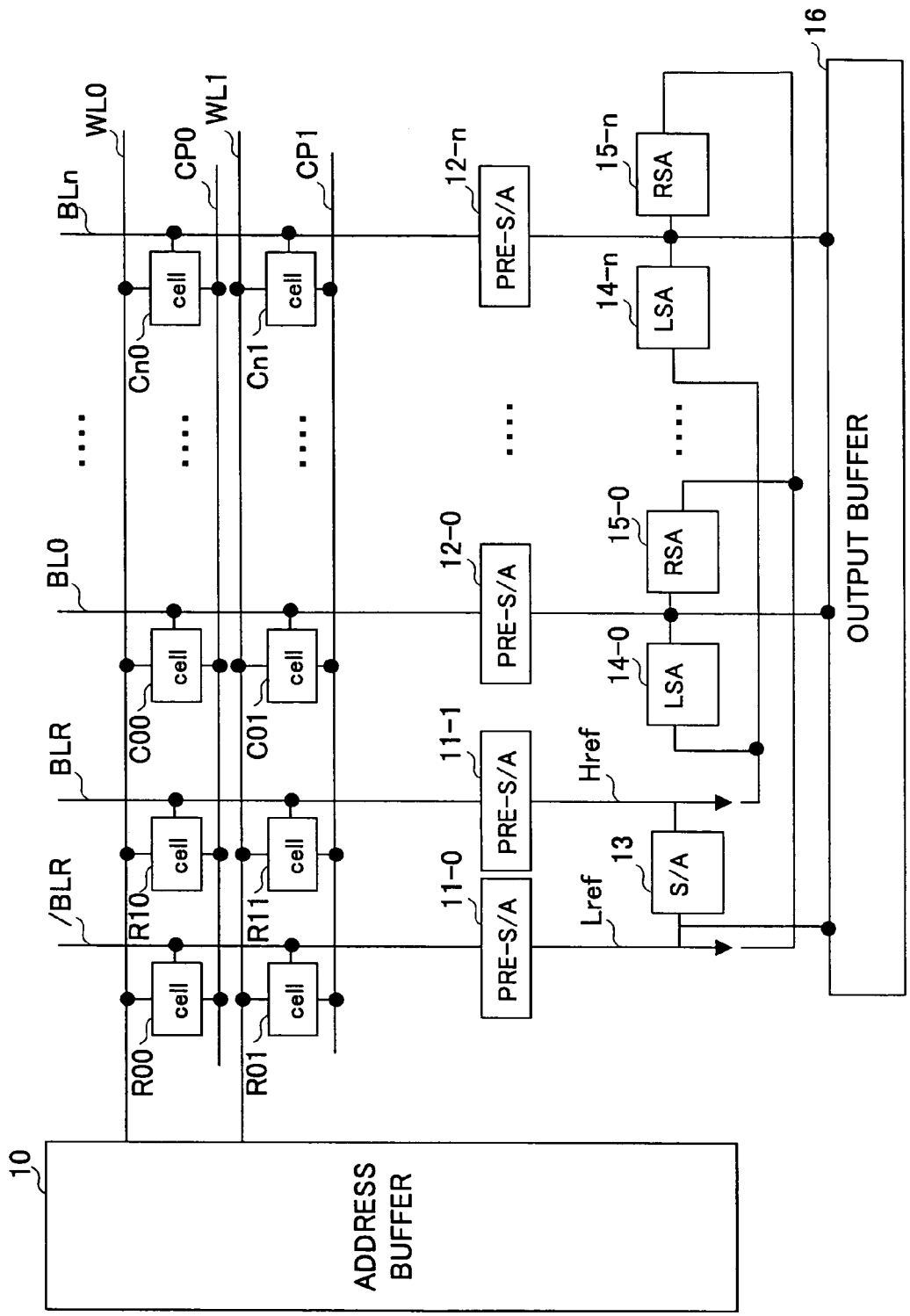
FIG. 1 is a drawing showing an example of the construction of a related-art semiconductor memory device.
Figure 7:
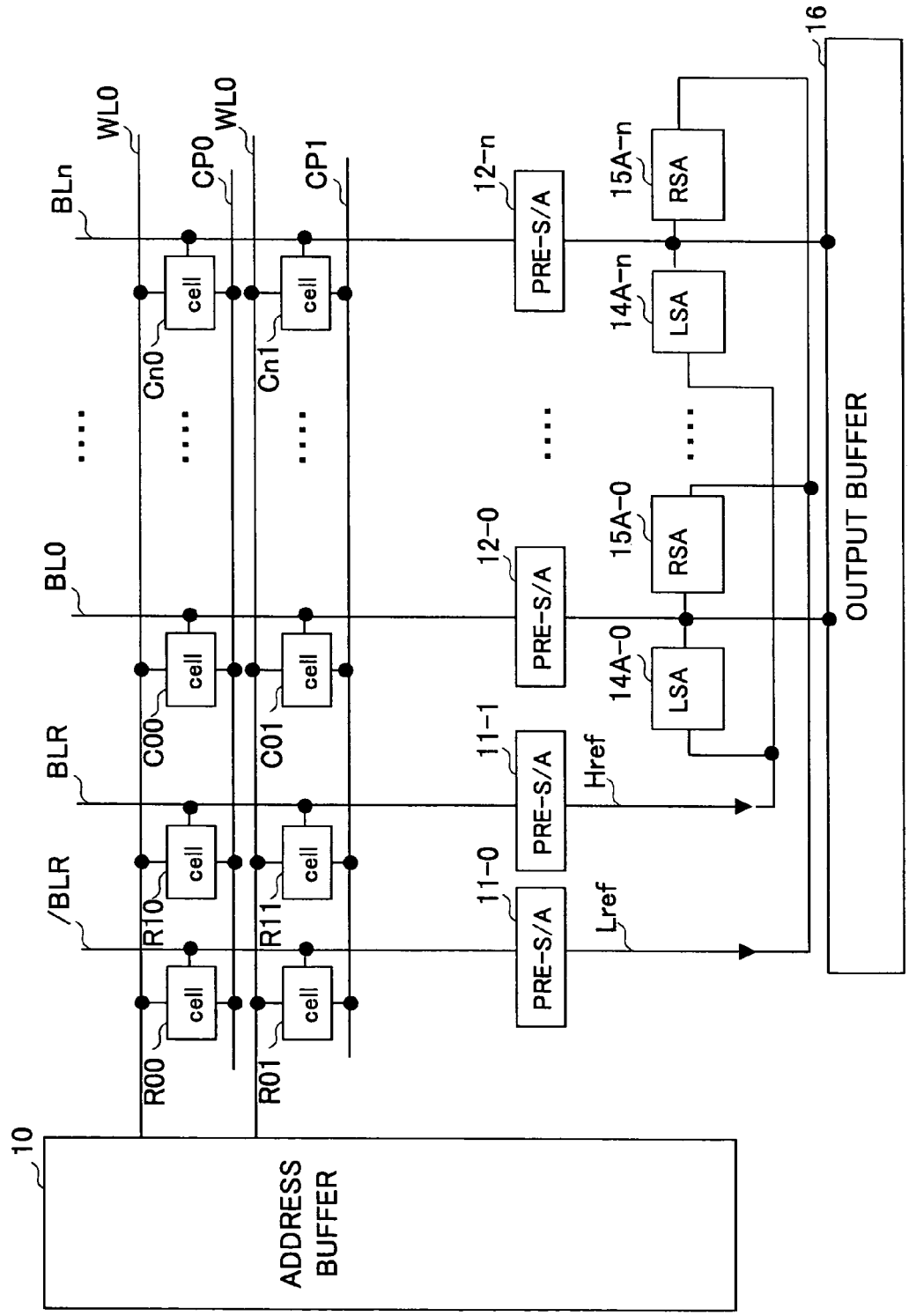
FIG. 7 is a block diagram showing the construction of a second embodiment of the semiconductor memory device according to the invention.

FIG. 7 is a block diagram showing the construction of a second embodiment of the semiconductor memory device according to the invention. In FIG. 7, the same elements as those of FIG. 1 or FIG. 6 are referred to by the same numerals, and a description thereof will be omitted.

In the semiconductor memory device of FIG. 7, unlike the first embodiment, the reference cells R00 through R11 are configured to have the same cell size as the memory cells C00 through Cn1. However, the sense amplifier 14A-0 through 14 A–n and 15A-0 through 15 A–n are provided with the capability of imparting an offset to the reference potentials. With this provision, the reference potential Lref is offset so as to be positioned on the highest potential side of the data potential distribution 30 corresponding to "0" memory cells, and the reference potential Href is offset so as to be positioned on the lowest potential side of the data potential distribution 31 corresponding to "1" memory cells, with such positioning being achieved without changing cell size. This provides for incorrect data reading to be prevented.

Figure 8:
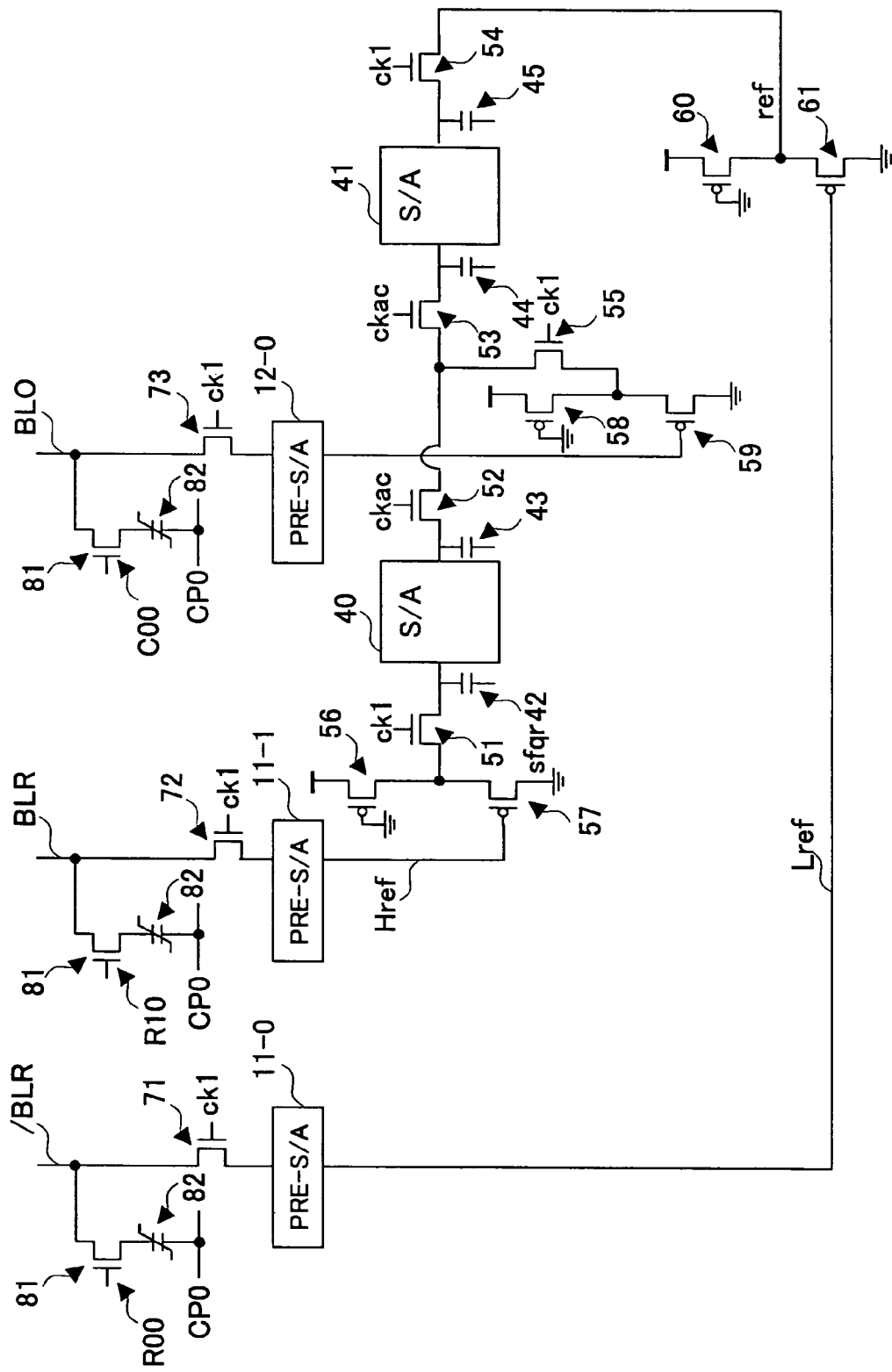
FIG. 8 is a circuit diagram showing an example of the construction in which an offset function is provided for sense amplifiers.

FIG. 8 is a circuit diagram showing an example of the construction in which the offset function is provided for the sense amplifiers.

FIG. 8 illustrates a circuit portion that serves to sense read data from a memory cell COO based on the reference potentials supplied from the reference cells R00 and R10. Each of these reference cells and the memory cell includes an access transistor 81 and a ferroelectric cell 82. NMOS transistors 71 through 73 are gates for coupling the bit lines/BLR, BLR, and BL0 to the pre-sense amplifiers 11-0, 11-1, and 12-0, respectively. When a signal ck1 is set to HIGH, the NMOS transistors 71 through 73 become conductive.

The HIGH reference potential Href is supplied to the sense amplifier 40 through the circuitry comprised of a PMOS transistor 56, a PMOS source follower 57, and an NMOS transistor 51. The NMOS transistor 51 becomes conductive when the signal ck1 is set to HIGH. The LOW reference potential Lref is supplied to the sense amplifier 41 through the circuitry comprised of a PMOS transistor 60, a PMOS source follower 61, and an NMOS transistor 54. The NMOS transistor 54 becomes conductive when the signal ck1 is set to HIGH.

The data potential read from the memory cell COO is supplied to the sense amplifiers 40 and 41 through the circuitry comprised of a PMOS transistor 58, a PMOS source follower 59, and NMOS transistors 52, 53, and 55. When the signal ck1 is set to HIGH, the NMOS transistor 55 becomes conductive. The NMOS transistors 52 and 53 become conductive when a signal ckac is set to HIGH.

A capacitor 42 is provided on the Href side of the sense amplifier 40, and a capacitor 43 is provided on the data potential side. The capacitance of the capacitor 42 is configured to be larger than the capacitance of the capacitor 43. A capacitor 45 is provided on the Lref side of the sense amplifier 41, and a capacitor 44 is provided on the data potential side. The capacitance of the capacitor 45 is configured to be smaller than the capacitance of the capacitor 44. With this provision, the reference potential Lref is offset so as to be always positioned on the highest potential side of the data potential distribution 30 corresponding to "0" memory cells, and the reference potential Href is offset so as to be always positioned on the lowest potential side of the data potential distribution 31 corresponding to "1" memory cells. This prevents data reading from producing incorrect results.

As previously described, the reference potential Lref may be set equal to or higher than the highest data potential of the data potential distribution 30, and the reference potential Href may be set equal to or lower than the lowest data potential of the data potential distribution 31 (while maintaining Lref<Href). This also guarantees correct data sensing.

Figure 9:
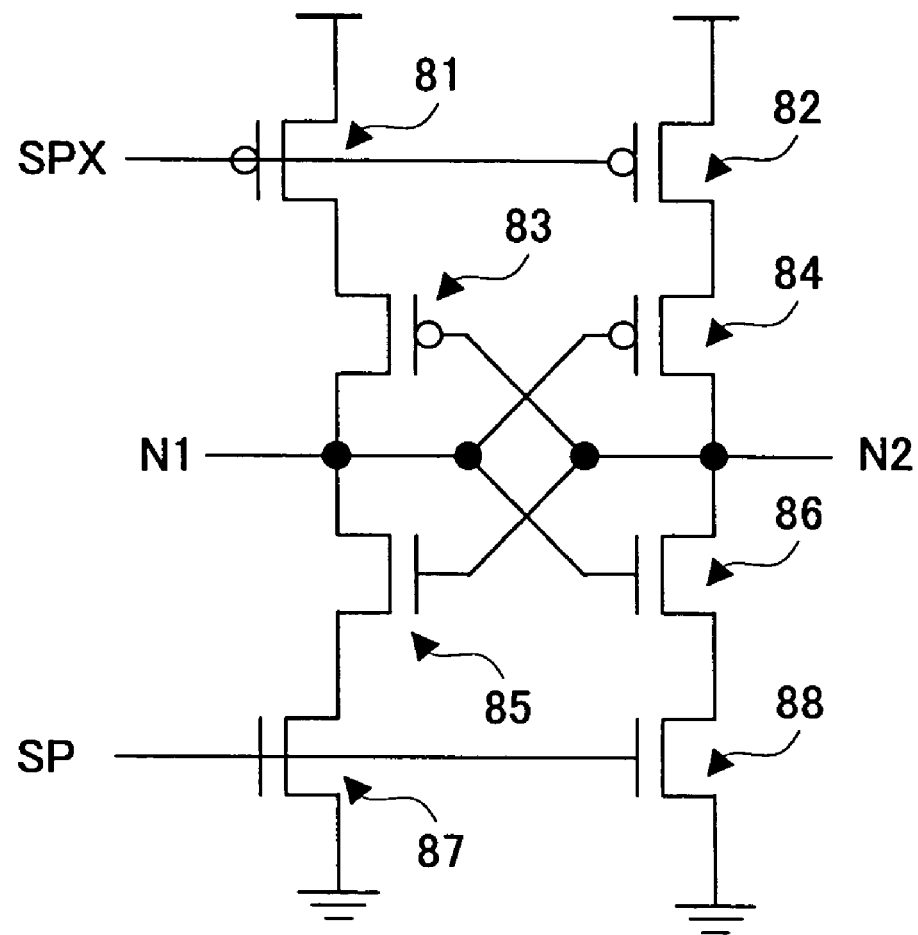
FIG. 9 is a circuit diagram showing an example of the construction of a sense amplifier of FIG. 8.

FIG. 9 is a circuit diagram showing an example of the construction of the sense amplifier 40 or 41 of FIG. 8. The sense amplifier 40 or 41 of FIG. 9 includes PMOS transistors 81 through 84 and the NMOS transistors 85 through 88. When signals SP and SPX are set to HIGH and LOW, respectively, a sensing operation starts, thereby amplifying a potential difference between terminals N1 and N2. Here, the PMOS transistor 83 and the NMOS transistor 85 together constitute a first inverter, and the PMOS transistor 84 and the NMOS transistor 86 together make up a second inverter. The output of one of the first and second inverters is connected to the input of the other inverter, thereby constituting a latch.

Figure 10:
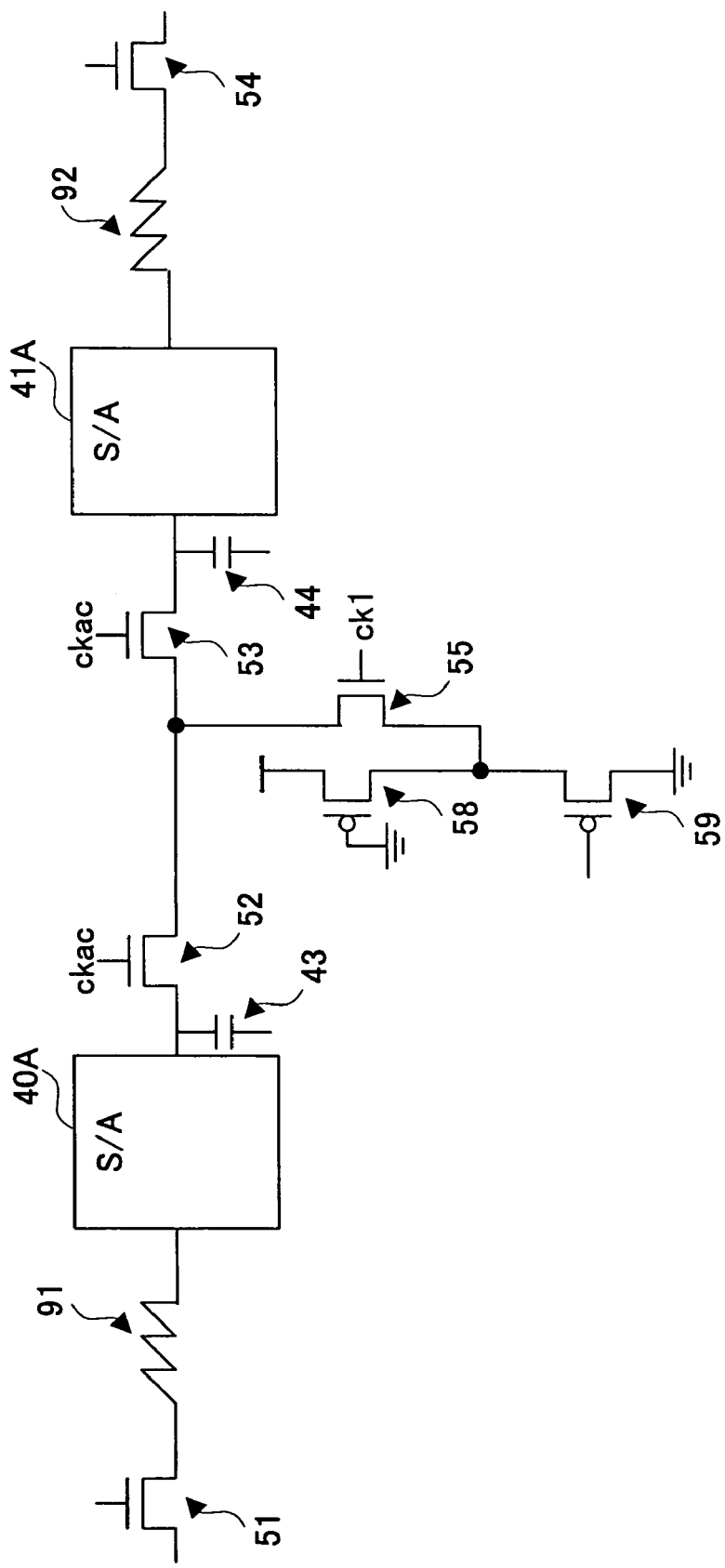
FIG. 10 is a circuit diagram showing another example of the construction in which an offset function is provided in sense amplifiers.

FIG. 10 is a circuit diagram showing another example of the construction in which an offset function is provided in the sense amplifiers. In FIG. 10, the same elements as those of FIG. 8 are referred to by the same numerals, and a description thereof will be omitted.

In FIG. 10, resistors 91 and 92 serve to offset the reference potential Lref so as to position it on the highest potential side of the data potential distribution 30 corresponding to "0" memory cells and to offset the reference potential Href so as to position it on the lowest potential side of the data potential distribution 31 corresponding to "1" memory cells. In FIG. 8, the sense amplifiers 40 and 41 are latch-type sense amplifiers as shown in FIG. 9. On the other hand, the sense amplifiers 40A and 41A of FIG. 10 need to generate a potential difference by letting currents flow through the resistance 91 and 92, and thus need to be differential amplifiers of the current-mirror type that allow the passage of a constant current.

Figure 11:
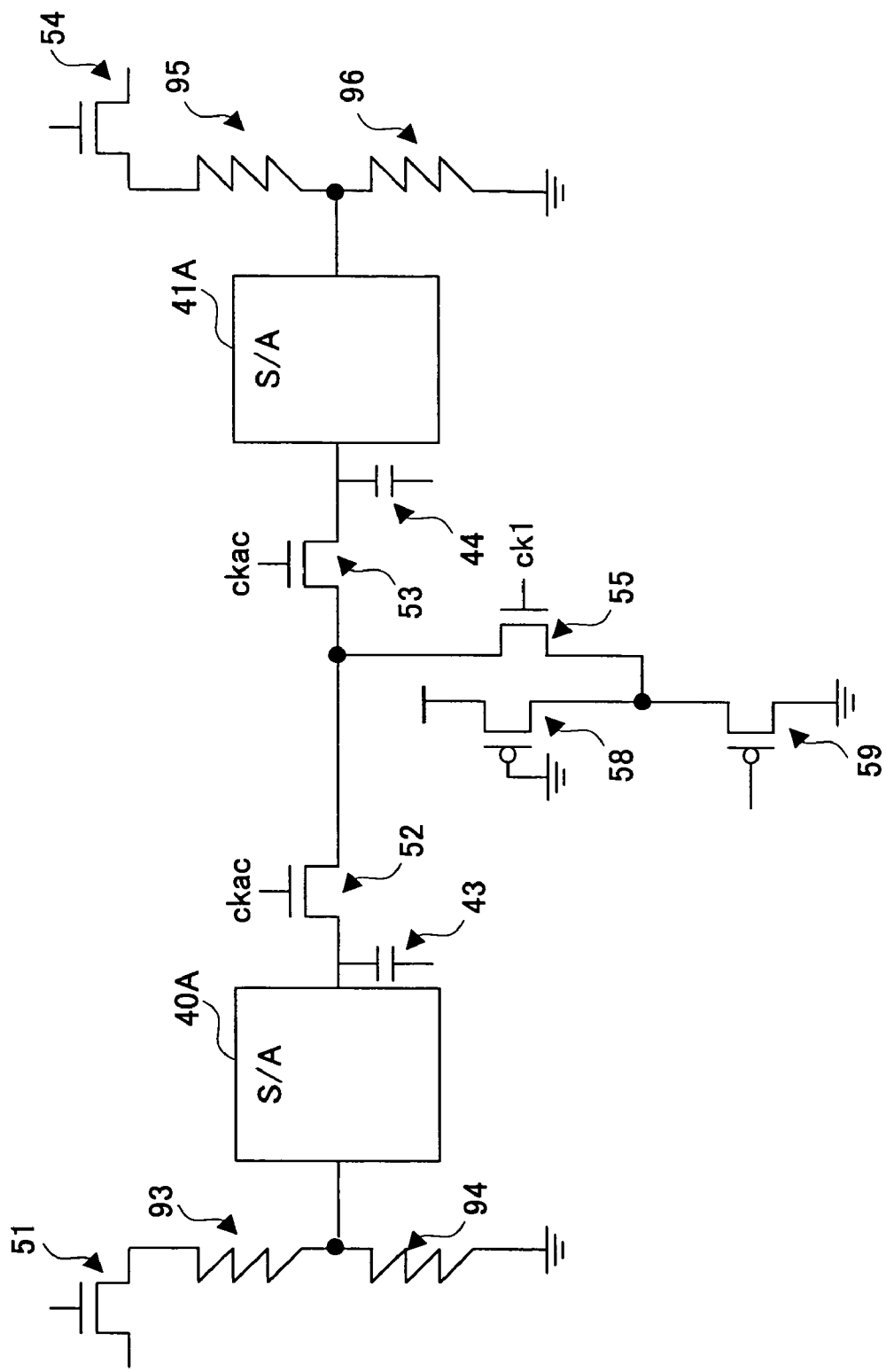
FIG. 11 is a circuit diagram showing yet another example of the construction in which an offset function is provided in sense amplifiers.

FIG. 11 is a circuit diagram showing yet another example of the construction in which an offset function is provided in the sense amplifiers. In FIG. 11, the same elements as those of FIG. 8 are referred to by the same numerals, and a description thereof will be omitted.

In FIG. 11, resistors 93 through 96 serve to offset the reference potential Lref so as to position it on the highest potential side of the data potential distribution 30 corresponding to "0" memory cells and to offset the reference potential Href so as to position it on the lowest potential side of the data potential distribution 31 corresponding to "1" memory cells.

Figure 12:
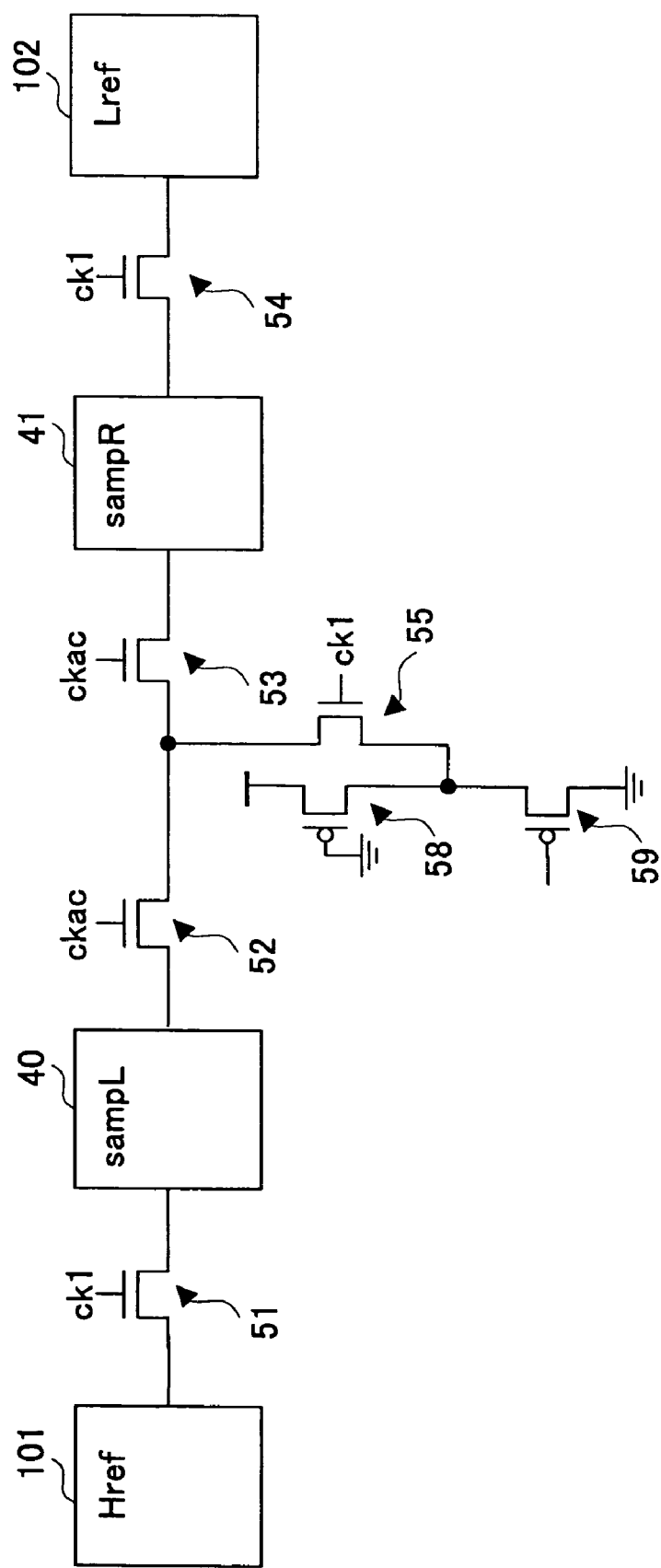
FIG. 12 is a circuit diagram showing the construction of a third embodiment of the semiconductor memory device according to the invention.

FIG. 12 is a circuit diagram showing the construction of a third embodiment of the semiconductor memory device according to the invention. The circuit diagram of FIG. 12 only shows a circuit portion around the sense amplifiers. In FIG. 12, the same elements as those of FIG. 8 are referred to by the same numerals, and a description thereof will be omitted.

In the third embodiment shown in FIG. 12, the reference potentials Href and Lref are not supplied as potentials read from reference cells, but are supplied from constant-voltage power supplies 101 and 102. Such construction based on the constant-voltage power supplies can also set the reference potential Lref at an offset position on the highest potential side of the data potential distribution 30 corresponding to "0" memory cells and set the reference potential Href at an offset position on the lowest potential side of the data potential distribution 31 corresponding to "1" memory cells. This makes it possible to prevent data reading from producing incorrect results.

As previously described, the reference potential Lref may be set equal to or higher than the highest data potential of the data potential distribution 30, and the reference potential Href may be set equal to or lower than the lowest data potential of the data potential distribution 31 (while maintaining Lref<Href). This also guarantees correct data sensing.

Figure 13:
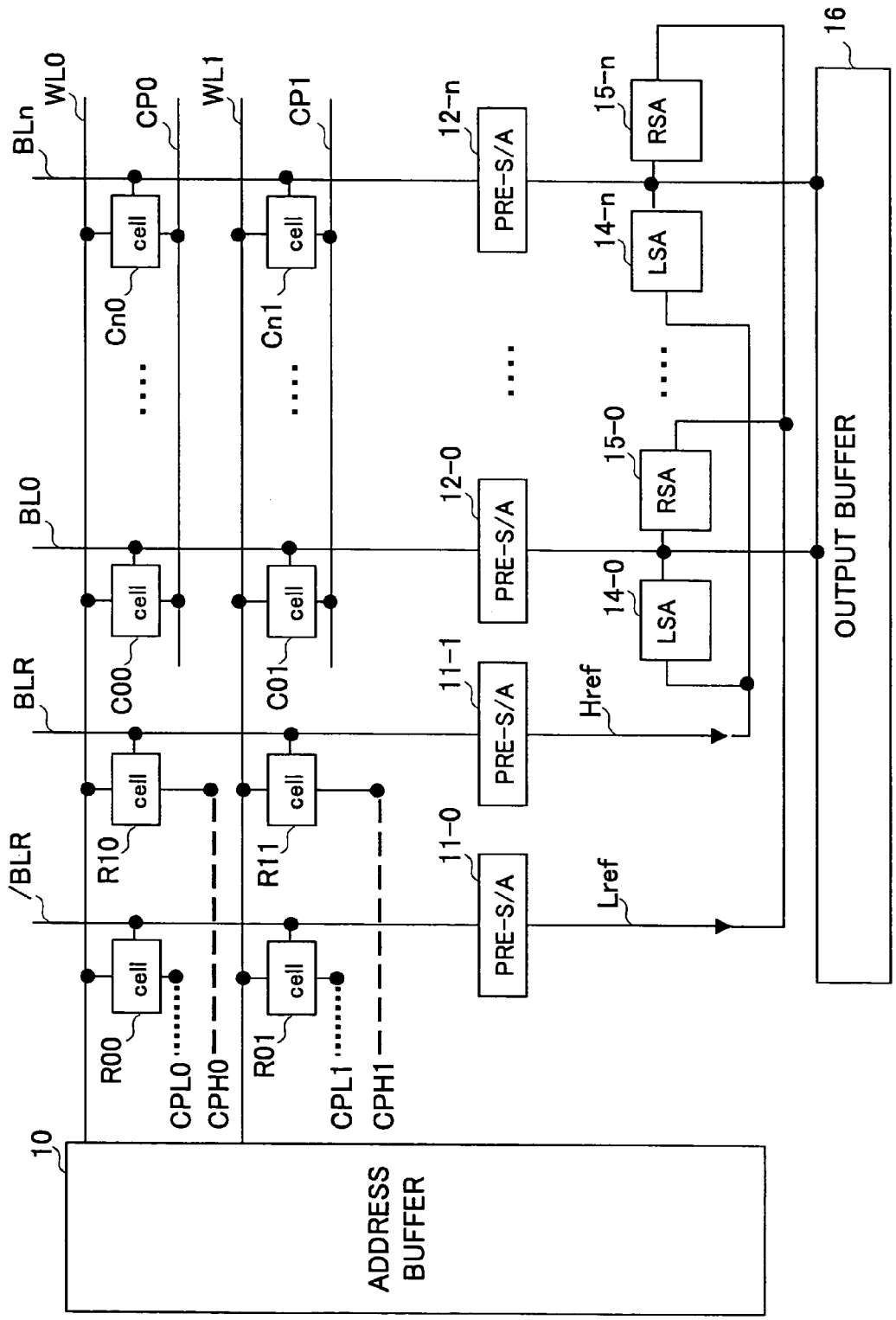
FIG. 13 is a block diagram showing the construction of a fourth embodiment of the semiconductor memory device according to the invention.

FIG. 13 is a block diagram showing the construction of a fourth embodiment of the semiconductor memory device according to the invention. In FIG. 13, the same elements as those of FIG. 1 or FIG. 6 are referred to by the same numerals, and a description thereof will be omitted.

In the semiconductor memory device of FIG. 13, unlike the first embodiment, the reference cells R00 through R11 are configured to have the same cell size as the memory cells C00 through Cn1. However, the reference cells R00 and R10 are driven by plate lines CPL0 and CPH0 that are different from the plate line CP0 for driving the memory cells C00 through Cn0. Moreover, the reference cells R01 and R11 are driven by plate lines CPL1 and CPH1 that are different from the plate line CP1 for driving the memory cells C01 through Cn1. Specifically, the plate lines CPL0 and CPL1 corresponding to the LOW reference are driven by a voltage Hv, and the plate lines CPH0 and CPH1 corresponding to the HIGH reference are driven by a voltage Lv, with the plate lines CP0 and CP1 for the memory cells being driven by a voltage Mv. Here, Hv, Mv, and Lv are related as: Hv>Mv>Lv.

With this provision, the reference potential Lref is always offset so as to be positioned on the highest potential side of the data potential distribution 30 corresponding to "0" memory cells, and the reference potential Href is offset so as to be positioned on the lowest potential side of the data potential distribution 31 corresponding to "1" memory cells, with such positioning being achieved without changing cell size. This provides for incorrect data reading to be prevented.

As previously described, the reference potential Lref may be set equal to or higher than the highest data potential of the data potential distribution 30, and the reference potential Href may be set equal to or lower than the lowest data potential of the data potential distribution 31 (while maintaining Lref<Href). This also guarantees correct data sensing.

Figure 14:
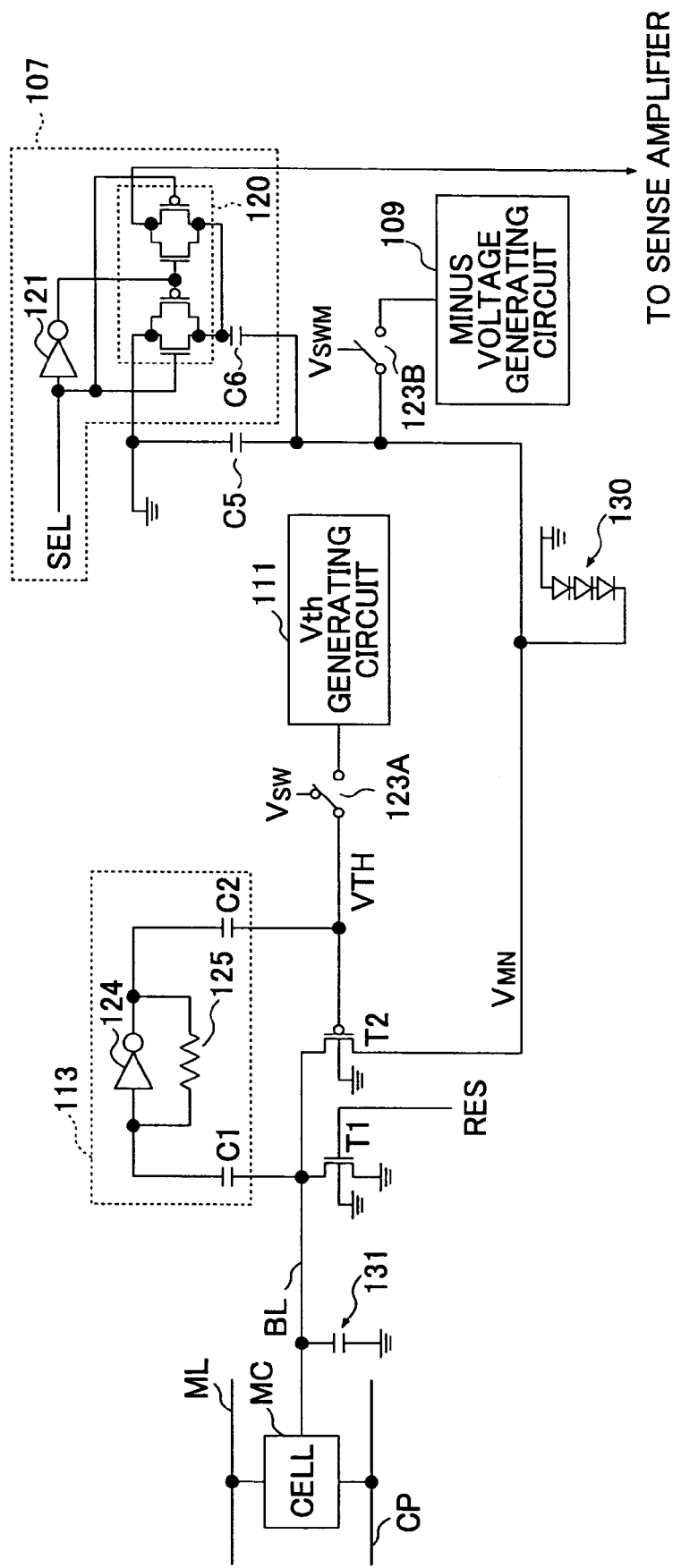
FIG. 14 is a circuit diagram showing the construction of a fifth embodiment of the semiconductor memory device according to the invention.

FIG. 14 is a circuit diagram showing the construction of a fifth embodiment of the semiconductor memory device according to the invention. The circuit diagram of FIG. 14 only shows a portion around a pre-sense amplifier, and outputs the electric charge of data to a sense amplifier as it is read from a memory cell MC to the bit line BL.

The circuit of FIG. 14 includes a voltage shift circuit 107, a minus voltage generating circuit 109, a Vth generating circuit 111, a feedback circuit 113, an NMOS transistor T1, a PMOS transistor T2, a capacitor C5, switches 123A and 123B, and a clamp circuit 130.

The voltage shift circuit 107 includes a gate circuit 120, an inverter 121, and a capacitor C6. The feedback circuit 113 includes capacitors C1 and C2, an inverter 124, and a resistor 125.

The bit line BL, a plate line CP, and a word line WL are connected to the memory cell MC. A bit line capacitance 131 represents the parasitic capacitance of the bit line BL.

The capacitor C6 of the voltage shift circuit 107 is connected in parallel with the capacitor C5, and the output node of the voltage shift circuit 107 is connected to a sense amplifier. The minus voltage generating circuit 109 generates a minus voltage VMN for supply to the bit line BL through the switch 123B.

The Vth generating circuit 111 generates a threshold voltage VTH for supply to the gate of the PMOS transistor T2 through the switch 123A. The feedback circuit 113 is provided between the bit line BL and the gate of the PMOS transistor T2.

The switch 123A is controlled according to a supplied voltage VSW, and the switch 123B is controlled according to a supplied voltage VSWM.

FIG. 15 is a timing chart showing the operation of the circuit shown in FIG. 14. As shown in FIG. 15-(a), a signal RES supplied to the gate of the NMOS transistor T1 is activated to become HIGH at time T1. In response, the potential of the bit line BL shown in FIG. 15-(f) is initialized to a ground potential. Moreover, as shown in FIG. 15-(d), the voltage VSW is set to LOW between time T1 and time T2 to close the switch 123A, thereby applying the threshold voltage VTH to the gate of the PMOS transistor T2. The threshold voltage VTH generated by the Vth generating circuit 111 is about −0.7 V.

The voltage VTH is substantially equal to the threshold voltage of the P-channel MOS transistor T2, so that the PMOS transistor T2 is put in an intermediate state between the nonconductive state (OFF state) and the conductive state (ON state). It follows that even the slightest drop of the gate voltage brings about an ON state, and a rise of the gate voltage brings about an OFF state.

As shown in FIG. 15-(a), the signal RES is deactivated to become LOW at time T3, resulting in the NMOS transistor T1 being turned off. Then, as shown in FIG. 15-(b), the voltage VSWM is changed to LOW at time T4, thereby closing the switch 123B. As a result, as shown in FIG. 15-(g), the voltage VMN is set to about −2.3 V owing to the negative voltage generated by the minus voltage generating circuit 109. The voltage VMN may alternatively be set to −3V, −1.5 V, or the like.

In the initial state, a signal SEL is HIGH as shown in FIG. 15-(c), so that the capacitor C5 and the capacitor C6 are connected in parallel. The voltage shift circuit 107 outputs a voltage that is obtained by shifting the voltage VMN by 2.3 V toward a positive voltage. Namely, the voltage VMN that is negative is shifted up to a positive voltage range, so that the latch-type sense amplifier provided at a subsequent stage can operate within a positive voltage range.

As shown in FIG. 15-(c), the signal SEL is HIGH between time T1 and time T5, so that one end of the capacitor C6 is coupled to the ground. When the signal SEL changes to LOW after time T5, the above-noted end of the capacitor C6 is coupled to the sense amplifier through the gate 120. With this, the input of the sense amplifier is set to a voltage that is higher than the voltage VMN by approximately 2.3 V.

Thereafter, as shown in FIG. 15-(e), the potential of the plate line CP changes from the ground potential to the power supply potential Vcc at time T6. In response, electric charge flows into the bit line BL from the memory cell MC, resulting in a rise of the potential of the bit line BL. If the potential of the bit line BL rises higher than the ground potential, the gate voltage of the PMOS transistor T2 is lowered by the feedback circuit 113. This makes the P-channel MOS transistor T2 conductive, allowing a current to run between the source node and the drain node. As a result, the electric charge of the bit line BL flows into a portion having the negative voltage VMN.

Consequently, the voltage VMN rises at time T6 as shown in FIG. 15-(g) while the potential of the bit line BL is maintained LOW as shown in FIG. 15-(f). The fact that the voltage of the bit line BL does not change means that the bit line BL is in a low-impedance state.

In this manner, the electric charge read to the bit line BL is transmitted to the portion having the negative voltage VMN through the PMOS transistor T2.

The voltage VMN is also a voltage applied between the opposite ends of the capacitor C5. The electric charge read from the memory cell MC is transferred to the capacitor C5, thereby avoiding a rise of the potential of the bit line BL. As a result, the voltage of the capacitor C5 changes in accordance with the amount of electric charge stored by polarization in the memory cell MC. Since the voltage of the capacitor C5 is coupled to the input of the sense amplifier through the capacitor C6, the sense amplifier detects the state of polarization of the memory cell MC.

The voltage of data read from the memory cell MC is divided by the parasitic capacitance 131 of the bit line and the capacitor C5. The smaller the capacitance of the capacitor C5, the larger the voltage generated by C5.

When the capacitance of the capacitor C5 is made small, therefore, a potential generated by reading of data "1" rises as shown by a dotted line D1 in FIG. 15-(g). Since the voltage VMN starts from a negative potential, the potential generated by reading data "1" is, in actuality, clamped to the ground potential as shown by a dotted line D2. As a result, the distribution of "1" data of a memory cell has an upper portion thereof cut off, resulting in the read data having a narrowed distribution.

Moreover, the clamp circuit 130 clamps the distribution of data-"0" potential of a memory cell to a particular potential. This makes it possible to suppress a spread of the data potential distribution of "0" memory cells.

In the fifth embodiment of the invention as described above, data read from a memory cell at the time of data reading is clamped, such that the potential distribution of the read data is cut off at the clamping level. As a consequence, an offset is given to the read data relative to the reference potentials at a subsequent sense-amplifier stage. This makes it possible to prevent data reading from producing incorrect results. Moreover, the narrowing of the data potential distribution serves to increase a margin of the sensing operation.

Further, the present invention is not limited to these embodiments, but various variations and modifications may be made without departing from the scope of the present invention.

What is claimed is:

1. A semiconductor memory device, comprising
   a first reference circuit which generates a first reference potential;
   a second reference circuit which generates a second reference potential;
   a memory cell;
   a first sense amplifier which senses a data potential read from said memory cell through comparison with the first reference potential; and
   a second sense amplifier which senses the data potential read from said memory cell through comparison with the second reference potential,
   wherein said first sense amplifier and said second sense amplifier cooperate to determine whether the data potential is "0" or "1", the first reference potential being positioned on a highest potential side of a data potential distribution of a "0" data potential read from the memory cell, and the second reference potential being positioned on a lowest potential side of a data potential distribution of a "1" data potential read from the memory cell.

2. The semiconductor memory device as claimed in claim 1, wherein the first reference potential is positioned substantially at a highest potential of the data potential distribution of a "0" data potential read from the memory cell, and the second reference potential is positioned substantially at a lowest potential of the data potential distribution of a "1" data potential read from the memory cell.

3. The semiconductor memory device as claimed in claim 1, wherein the first reference potential is positioned higher than a highest potential of the data potential distribution of a "0" data potential read from the memory cell, and the second reference potential is positioned lower than a lowest potential of the data potential distribution of a "1" data potential read from the memory cell.

4. The semiconductor memory device as claimed in claim 1, wherein said first reference circuit includes a reference cell having a larger size than the memory cell, and said second reference circuit includes a reference cell having a smaller size than the memory cell.

5. The semiconductor memory device as claimed in claim 1, wherein said first sense amplifier includes a first circuit which raises the first reference potential relative to the data potential thereby to position the first reference potential on the highest potential side of the data potential distribution of a "0" data potential read from the memory cell, and said second sense amplifier includes a second circuit which lowers the second reference potential relative to the data potential thereby to position the second reference potential on the lowest potential side of the data potential distribution of a "1" data potential read from the memory cell.

6. The semiconductor memory device as claimed in claim 5, wherein each of said first circuit and said second circuit includes a capacitor.

7. The semiconductor memory device as claimed in claim 5, wherein each of said first circuit and said second circuit includes a resistor.

8. The semiconductor memory device as claimed in claim 1, wherein each of said first reference circuit and said second reference circuit is a constant voltage source.

9. The semiconductor memory device as claimed in claim 1, wherein said memory cell is a ferroelectric cell driven by a first plate potential, and wherein said first reference circuit is a ferroelectric cell driven by a plate potential lower than the first plate potential, and said second reference circuit is a ferroelectric cell driven by a plate potential higher than the first plate potential.

10. A semiconductor memory device, comprising
a first reference circuit which generates a first reference potential;
a second reference circuit which generates a second reference potential;
a memory cell;
a clamp circuit which clamps a data potential read from the memory cell thereby to narrow a data potential distribution of the data potential;
a first sense amplifier which senses the data potential having the narrowed data potential distribution through comparison with the first reference potential; and
a second sense amplifier which senses the data potential having the narrowed data potential distribution through comparison with the second reference potential,
wherein said first sense amplifier and said second sense amplifier cooperate to determine whether the data potential is "0" or "1".

* * * * *